(12) United States Patent
Lin et al.

(10) Patent No.: US 11,158,723 B2
(45) Date of Patent: Oct. 26, 2021

(54) SEMICONDUCTOR STRUCTURE AND METHOD OF FORMING THE SAME

(71) Applicant: Vanguard International Semiconductor Corporation, Hsinchu (TW)

(72) Inventors: Chih-Hung Lin, Taichung (TW); Chia-Hao Lee, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 9 days.

(21) Appl. No.: 16/809,279

(22) Filed: Mar. 4, 2020

(65) Prior Publication Data

US 2021/0280693 A1 Sep. 9, 2021

(51) Int. Cl.
*H01L 29/66* (2006.01)
*H01L 29/10* (2006.01)
*H01L 29/423* (2006.01)

(52) U.S. Cl.
CPC .... *H01L 29/66704* (2013.01); *H01L 29/1095* (2013.01); *H01L 29/42364* (2013.01)

(58) Field of Classification Search
CPC ............ H01L 29/7816; H01L 29/7835; H01L 29/7831; H01L 29/66681; H01L 29/66484
See application file for complete search history.

(56) References Cited

U.S. PATENT DOCUMENTS

| 8,247,869 | B2* | 8/2012 | Yang | H01L 29/4238 257/336 |
| 8,946,851 | B1* | 2/2015 | McGregor | H01L 29/0634 257/492 |
| 10,573,743 | B2* | 2/2020 | Shinohara | H01L 29/42368 |

FOREIGN PATENT DOCUMENTS

| TW | 200412667 A | 7/2004 |
| TW | 200511508 A | 3/2005 |
| TW | 201914005 A | 4/2019 |
| TW | 201916174 A | 4/2019 |

OTHER PUBLICATIONS

Taiwanese Office Action and Search Report for Taiwanese Application No. 108146599, dated Feb. 2, 2021.

* cited by examiner

Primary Examiner — Raj R Gupta
(74) Attorney, Agent, or Firm — Birch, Stewart, Kolasch & Birch, LLP (57) ABSTRACT

A semiconductor structure is provided. The semiconductor structure includes a substrate, a first well region, a second well region, an isolation structure, and a gate structure. The first well region is disposed in the substrate. The second well region is disposed in the substrate. The second well region is adjoining the first well region. The isolation structure is disposed in the first well region. The gate structure is disposed on the substrate. The gate structure includes a first gate portion and a second gate portion. The first gate portion overlaps the first well region and the second well region. There is an opening between the first gate portion and the second gate portion exposing a portion of the isolation structure.

20 Claims, 6 Drawing Sheets

SEMICONDUCTOR STRUCTURE AND METHOD OF FORMING THE SAME

BACKGROUND

Technical Field

The embodiments of the present disclosure relate to a semiconductor structure, and in particular, it relates to a laterally diffused metal oxide semiconductor.

Description of the Related Art

Semiconductor devices are used in many electronic devices, such as personal computers, mobile phones, digital cameras, and other electronic devices. The process of manufacturing a semiconductor device usually includes sequentially depositing materials of an insulating layer or a dielectric layer, a conductive layer, and a semiconductor layer on a substrate, and patterning different material layers using a lithography technique to form circuit components and electronic elements.

In a semiconductor process, a hot carrier injection test is performed on a semiconductor device. The semiconductor device may be a laterally diffused metal oxide semiconductor (LDMOS). The hot carrier injection test may damage the laterally diffused metal oxide semiconductor, however. This damage may cause leakage current. Furthermore, every time a hot carrier injection test is performed, the laterally diffused metal oxide semiconductor may suffer more damaged. Therefore, the leakage current gets worse, thereby affecting the reliability of the laterally diffused metal oxide semiconductor device.

Although existing laterally diffused metal oxide semiconductor devices have generally improved upon some problems, they are not satisfactory in all aspects. Therefore, a novel semiconductor structure is still needed to meet various needs.

SUMMARY

The embodiments of the present disclosure provide a semiconductor structure and a method of forming the same. By ensuring that the gate structure has an opening that exposes a portion of the isolation structure, the damage to the semiconductor structure caused by the hot carrier injection test can be effectively reduced, and the reliability of the semiconductor structure can be improved accordingly.

A semiconductor structure is provided according to some embodiments of the present disclosure. The semiconductor structure includes a substrate, a first well region, a second well region, an isolation structure, and a gate structure. The first well region is disposed in the substrate. The second well region is disposed in the substrate. The second well region is adjoining the first well region. The isolation structure is disposed in the first well region. The gate structure is disposed on the substrate. The gate structure includes a first gate portion and a second gate portion. The first gate portion overlaps the first well region and the second well region. There is an opening between the first gate portion and the second gate portion that exposes a portion of the isolation structure.

A method of forming a semiconductor structure is provided according to some embodiments of the present disclosure. The method includes: providing a substrate; forming a first well region in the substrate; forming a second well region in the substrate and adjoining the first well region; forming an isolation structure in the first well region; and forming a gate structure on the substrate. The gate structure includes a first gate portion and a second gate portion. The first gate portion overlaps the first well region and the second well region. There is an opening between the first gate portion and the second gate portion that exposes a portion of the isolation structure.

A detailed description is given in the following embodiments with reference to the accompanying drawings.

BRIEF DESCRIPTION OF THE DRAWINGS

The embodiments of the present disclosure will be described in detail below with reference made to the accompanying drawings. It should be noted that, in accordance with standard practice in the industry, the various features are not drawn to scale and are merely illustrative. In fact, the dimensions of the elements may be arbitrarily enlarged or reduced to clearly show the features of the embodiments of the present disclosure.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper," and the like, may be used herein to easily describe one element's or feature's relationship to another element(s) or feature(s) as illustrated in the figures. The spatially relative terms are intended to encompass different orientations of the device in use or operation, in addition to the orientation depicted in the figures. The apparatus may be otherwise oriented (e.g., rotated 90 degrees or at other orientations) and the spatially relative descriptors used herein may likewise be interpreted accordingly.

Herein, the terms "about", "approximately" and "substantially" typically mean+/−20% of the stated value or range, typically +/−10% of the stated value or range, typically +/−5% of the stated value or range, typically +/−3% of the stated value or range, typically +/−2% of the stated value or range, typically +/−1% of the stated value or range, and typically +/−0.5% of the stated value or range. The stated value of the present disclosure is an approximate value. Namely, the meaning of "about", "approximately" and "substantially" may be implied if there is no specific description of "about", "around" and "substantially".

It should be understood that although the terms "first", "second", "third" etc. may be used herein to describe various elements, components, regions, layers, and/or portions, these elements, components, regions, layers, and/or portions should not be limited by these terms. These terms are only used to distinguish one element, component, region, layer, and/or portion from another element, component, region, layer and/or portion. Thus, a first element, component, region, layer, and/or portion discussed below could be termed a second element, component, region, layer, and/or portion without departing from the teachings of the present disclosure.

Although the steps in some of the described embodiments are performed in a particular order, these steps can also be performed in other logical orders. In various embodiments, some of the described steps may be replaced or omitted, and some other operations may be performed before, during, and/or after the steps described in the embodiments of the present disclosure. The high electron mobility transistor in the embodiments of the disclosure may incorporate other features. Some features may be replaced or omitted in different embodiments.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Elements or layers with similar names may be formed using similar materials or methods unless otherwise stated.

Figure 1:
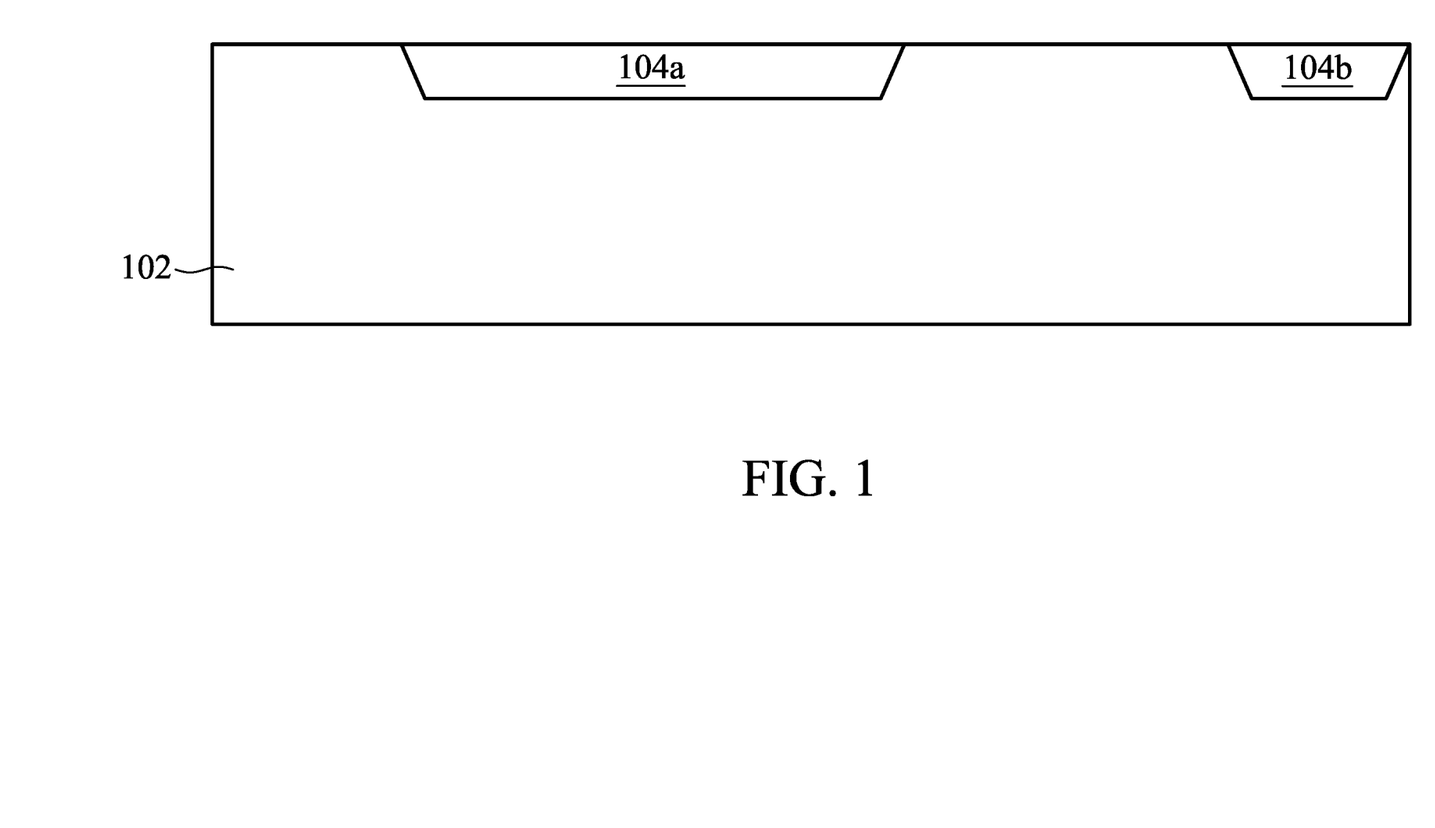
FIG. 1 is a cross-sectional view illustrating one stage of forming a semiconductor structure in accordance with the embodiments of the present disclosure.

FIGS. 1 to 4 and 6 are cross-sectional views illustrating different stages of forming a semiconductor structure 100 in accordance with some embodiments of the present disclosure. As shown in FIG. 1, a substrate 102 is provided. The substrate 102 may be a semiconductor substrate. The semiconductor substrate may be elementary semiconductors including silicon (Si) or germanium (Ge); compound semiconductors including gallium nitride (GaN), silicon carbide (SiC), gallium arsenide (GaAs), gallium phosphide (GaP), indium phosphide (InP), indium arsenide (InAs) and/or indium antimonide (InSb); alloy semiconductors including SiGe, GaAsP, AlInAs, AlGaAs, GaInAs, GaInP and/or (GaInAsP) or a combination thereof.

In some embodiments, the substrate 102 may be a single crystal substrate, a multi-layer substrate, a gradient substrate, other suitable substrates, or a combination thereof. Moreover, the substrate 102 may also be a semiconductor on insulator (SOI) substrate. The SOI substrate may include a base plate, a buried oxide (BOX) layer disposed on the base plate, or a semiconductor layer disposed on the buried oxide layer. In addition, in some embodiments, the substrate 102 is a substrate having a conductive type of n-type. In other embodiments, the substrate 102 is a substrate having a conductive type of p-type.

Next, still referring to FIG. 1, an isolation structure 104a and an isolation structure 104b are formed in the substrate 102. Specifically, the isolation structure 104a and the isolation structure 104b are embedded in the substrate 102. The top surface of the isolation structure 104a and the top surface of the isolation structure 104b are coplanar with the top surface of the substrate 102. In some embodiments, the isolation structures 104a and 104b may be formed by a local oxidation of silicon (LOCOS) process, a shallow trench isolation (STI) process, or a combination thereof. In some embodiments, the isolation structures 104a and 104b are formed of dielectric materials. In some embodiments, the dielectric materials of the isolation structures 104a and 104b include silicon oxide, silicon nitride, silicon oxynitride, other suitable dielectric materials, or a combination thereof.

Figure 2:
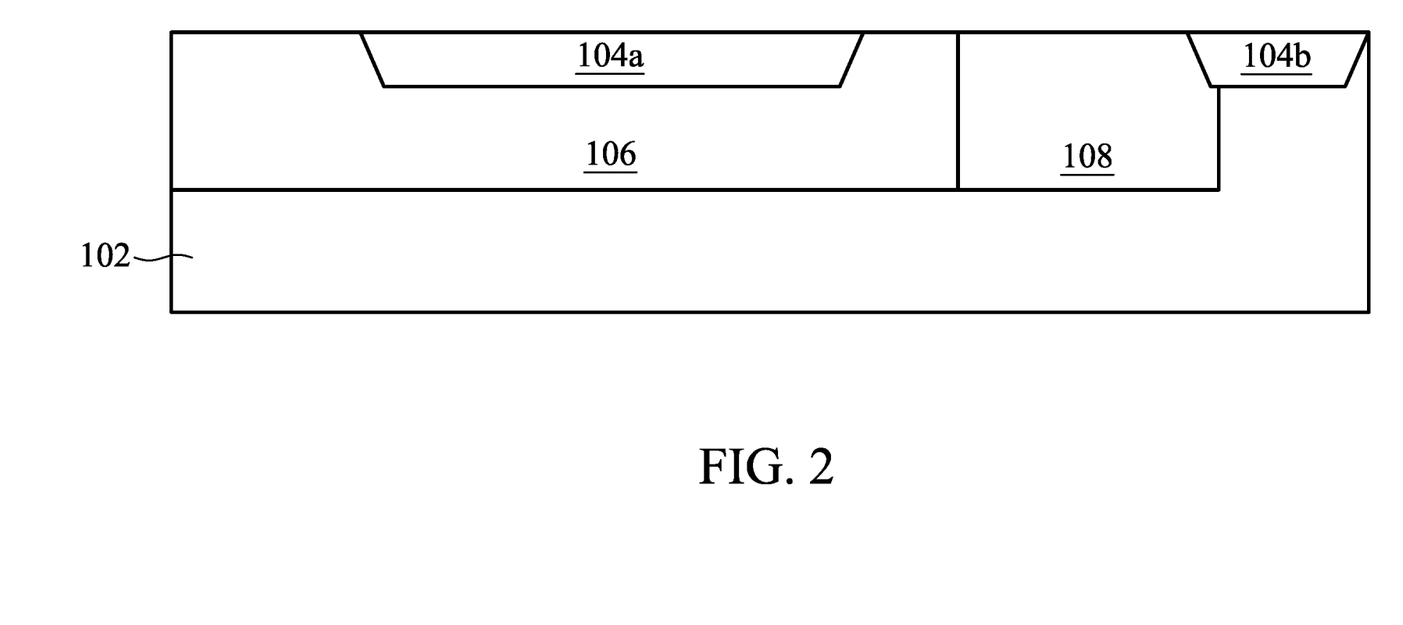
FIG. 2 is a cross-sectional view illustrating one stage of forming a semiconductor structure in accordance with the embodiments of the present disclosure.

Next, referring to FIG. 2, a first well region 106 and a second well region 108 that adjoins the first well region 106 are formed in the substrate 102. A portion of the first well region 106 is formed below the isolation structure 104a, and the second well region 108 is disposed between the isolation structure 104a and the isolation structure 104b.

In some embodiments, the first well region 106 and the second well region 108 may be formed by an ion implantation process. In some embodiments, the first well region 106 and the second well region 108 may be formed by two separate ion implantation processes. The first well region 106 and the second well region 108 may have different conductive types. In some embodiments, the first well region 106 has a first conductive type and the second well region 108 has a second conductive type that is opposite to the first conductive type. Alternatively, the first well region 106 has the second conductive type and the second well region 108 has the first conductive type. Specifically, in some embodiments, the first well region 106 may be a p-type well and the second well region 108 may be an n-type well to serve as an n-type metal-oxide-semiconductor field-effect transistor (NMOS). In some embodiments, the first well region 106 may be an n-type well and the second well region 108 may be a p-type well to serve as a p-type metal-oxide-semiconductor field-effect transistor (PMOS). In some embodiments, the doping concentration of the first well region 106 is between about $1\times10^{16}$ cm$^{-3}$ and $1\times10^{18}$ cm$^{-3}$. The doping concentration of the second well region 108 is between about $1\times10^{16}$ cm$^{-3}$ and $1\times10^{18}$ cm$^{-3}$.

Figure 3:
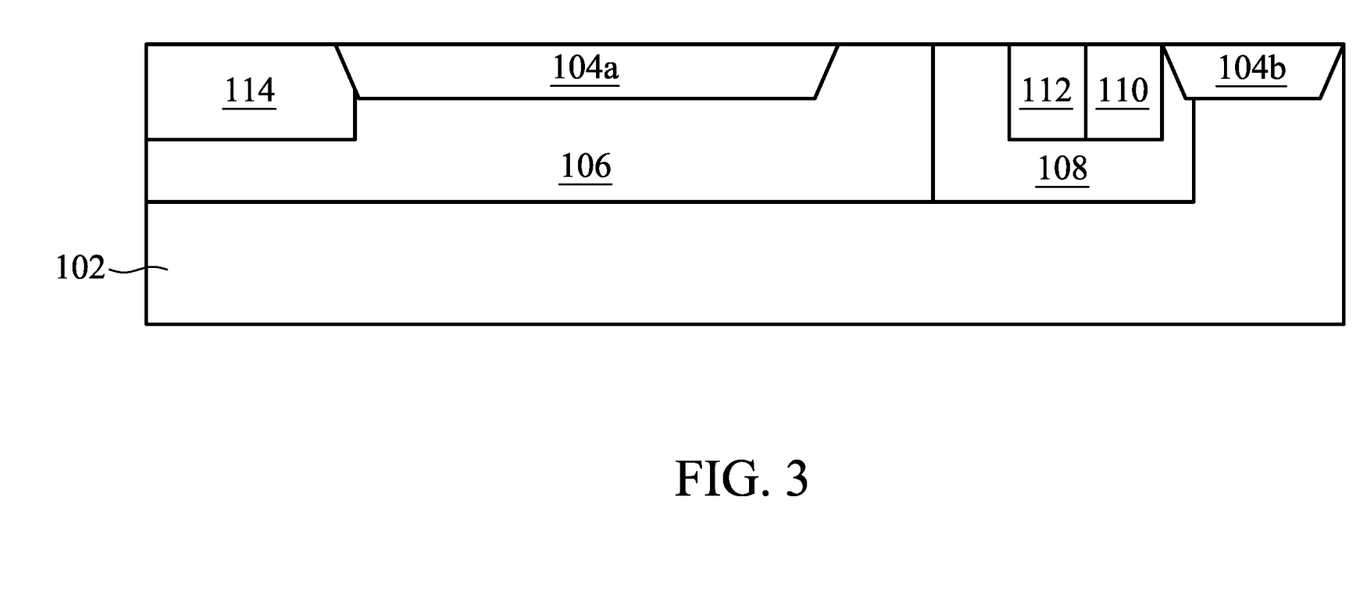
FIG. 3 is a cross-sectional view illustrating one stage of forming a semiconductor structure in accordance with the embodiments of the present disclosure.

Next, referring to FIG. 3, a first doped region 110 and a second doped region 112 are formed in the second well region 108, and a third doped region 114 is formed in the first well region 106. The first doped region 110 adjoins the second doped region 112. In some embodiments, the conductive type of the first doped region 110 is the same as that of the second well region 108, the conductive type of the second doped region 112 is different from that of the second well region 108, and the conductive type of the third doped region 114 is the same as that of the first well region 106. In some embodiments, the first doped region 110, the second doped region 112, and the third doped region 114 may be formed respectively, by implanting dopants of suitable conductive types by an ion implantation process. In some embodiments, the doping concentration of the first doped region 110 is between $1\times10^{18}$ cm$^{-3}$ and $1\times10^{21}$ cm$^{-3}$. The doping concentration of the second doped region 112 is between $1\times10^{18}$ cm$^{-3}$ and $1\times10^{21}$ cm$^{-3}$. The doping concentration of the third doped region 114 is between $1\times10^{18}$ cm$^{-3}$ and $1\times10^{21}$ cm$^{-3}$. In some embodiments, the doping concentrations of the first doped region 110 and the second doped region 112 are greater than that of the first well region 106, and the doping concentration of the third doped region 114 is greater than that of the second well region 108.

Figure 4:
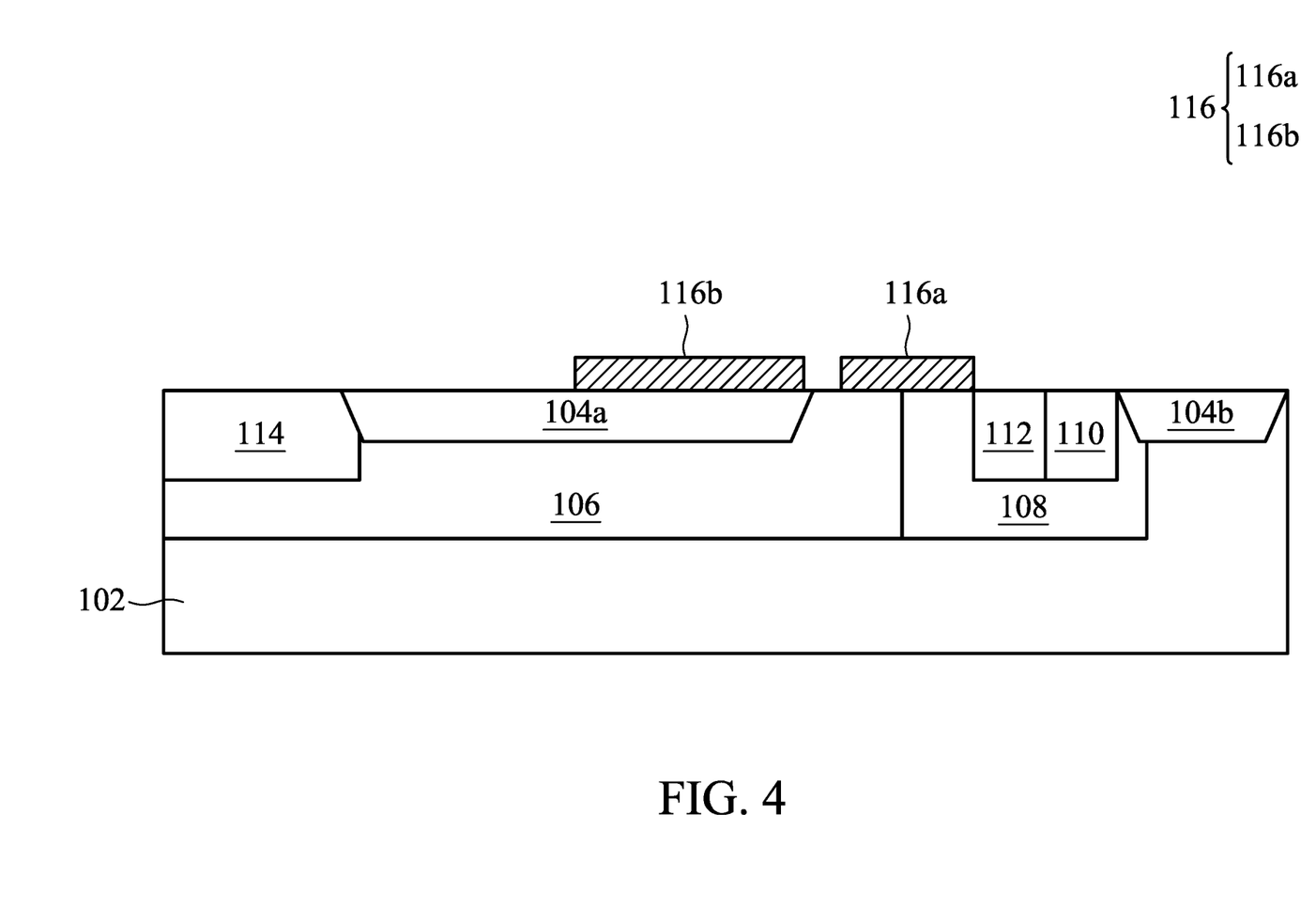
FIG. 4 is a cross-sectional view illustrating one stage of forming a semiconductor structure in accordance with the embodiments of the present disclosure.

Next, referring to FIG. 4, a gate structure 116 is formed on the first well region 106 and the second well region 108. The gate structure 116 includes a first gate portion 116a and a second gate portion 116b. The first gate portion 116a partially overlaps the first well region 106 and the second well region 108, and the second gate portion 116b covers a portion of the isolation structure 104a.

In some embodiments, the gate structure 116 may include single or multiple layers of gate dielectric layers, and single or multiple layers of gate electrode layers.

In some embodiments, the gate dielectric layer may include silicon oxide, silicon nitride, silicon oxynitride, high-k dielectric material, other suitable dielectric materials, or a combination thereof. The high-k dielectric material may include, but is not limited to, metal oxide, metal nitride, metal silicide, metal aluminate, zirconium silicate, zirconium aluminate, or a combination thereof. In some embodiments, the gate dielectric layer may be formed by a plasma enhanced chemical vapor deposition (PECVD) process, a spin coating process, other suitable processes, or a combination thereof.

In some embodiments, the gate electrode layer may include amorphous silicon, polycrystalline silicon, metal nitride, conductive metal oxide, metal, other suitable materials, or a combination thereof. The metal may include, but is not limited to, aluminum (Al), molybdenum (Mo), tungsten (W), titanium (Ti), tantalum (Ta), platinum (Pt), hafnium (Hf), or a combination thereof. The conductive metal oxide may include, but is not limited to, barium metal oxide or indium tin metal oxide. In some embodiments, the gate electrode layer may be formed by a chemical vapor deposition (CVD) process, a sputtering process, a resistance heating evaporation process, an electron beam evaporation process, a pulsed laser deposition process, or other suitable processes. The chemical vapor deposition process may include low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or other suitable process.

In addition, in some embodiments, the gate dielectric layer and the gate electrode layer may be patterned by a patterning process to form the gate structure 116 including the first gate portion 116a and the second gate portion 116b. To be specific, a photoresist material is formed on the gate dielectric layer and the gate electrode layer by a suitable process such as spin coating or chemical vapor deposition, atomic layer deposition, physical vapor deposition (PVD), molecular beam deposition, plasma enhanced chemical vapor deposition, other appropriate methods, or other suitable depositions or a combination thereof, and then optical exposure, post-exposure baking and development are performed to remove a portion of the photoresist material to form a patterned photoresist layer, and the patterned photoresist layer will serve as an etching mask for etching. A bi- or tri-layer photoresist can be performed. Then, the gate dielectric layer and the gate electrode layer can be etched to form the first gate portion 116a and the second gate portion 116b using any acceptable etching process, such as reactive ion etching, neutral beam etching, the like, or a combination thereof. Then, the patterned photoresist layer is removed.

Figure 5:
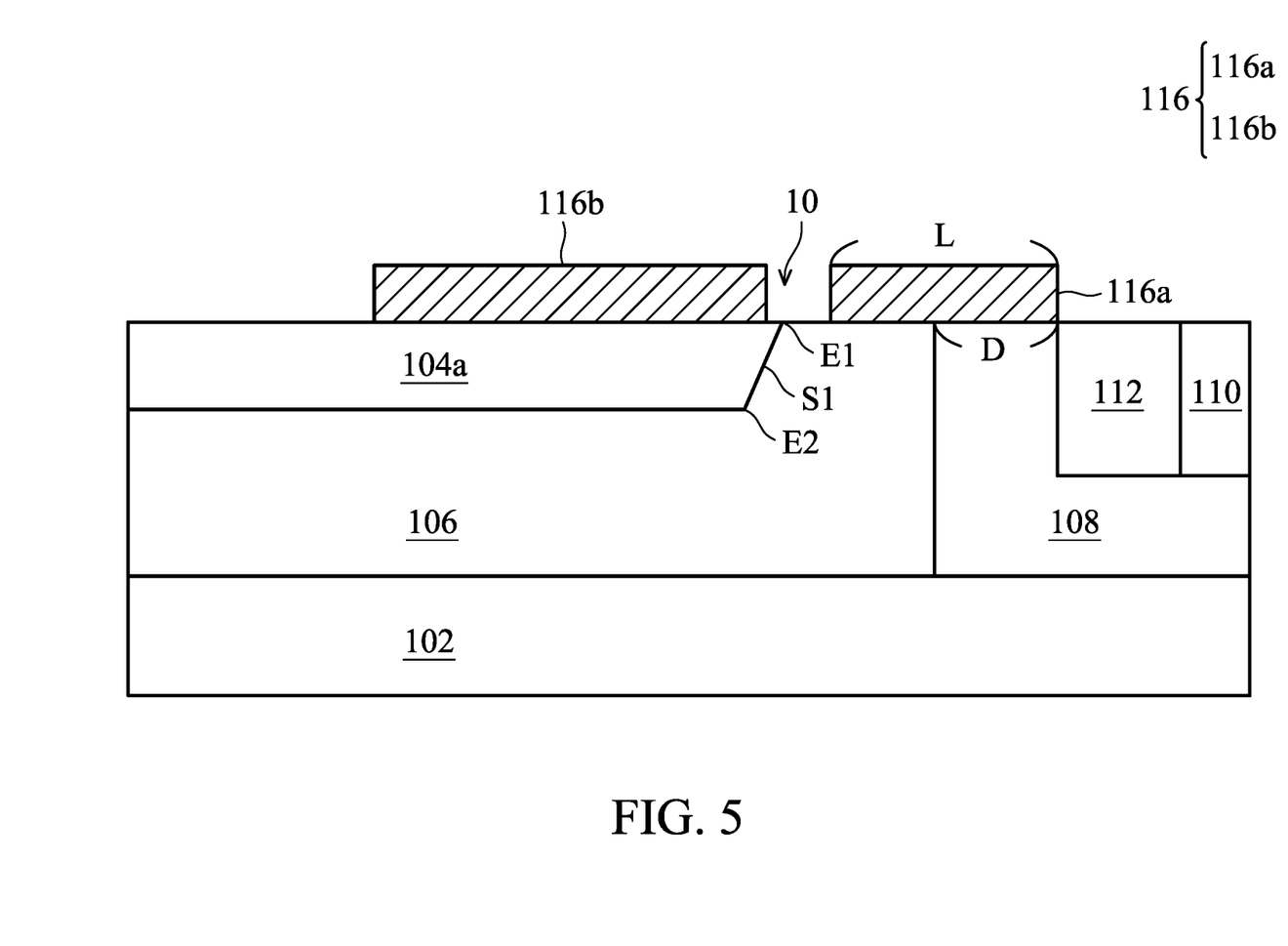
FIG. 5 is a partially enlarged view illustrating a semiconductor structure in accordance with the embodiments of the present disclosure.

Next, referring to FIG. 5, which is a partially enlarged view illustrating the semiconductor structure of FIG. 4. There is an opening 10 between the first gate portion 116a and the second gate portion 116b, and the opening 10 exposes a portion of the isolation structure 104a. To be specific, the isolation structure 104a has a first sidewall S1, which is close to the second well region 108. The opening 10 between the first gate portion 116a and the second gate portion 116b overlaps the first sidewall S1 of the isolation structure 104a in the direction of a vertical projection onto the substrate 102. In other words, a projection of the opening 10 projected vertically onto the substrate 102 overlaps a projection of the first sidewall S1 of the isolation structure 104 projected vertically onto the substrate 102. In some embodiments, the opening 10 overlaps one-third of the first sidewall S1 of the isolation structure 104a in the direction of a vertical projection onto the substrate 102. In other words, the projection of the opening 10 projected vertically onto the substrate 102 overlaps one-third of the projection of the first sidewall S1 of the isolation structure 104a projected vertically onto the substrate 102. To be specific, the first sidewall S1 of the isolation structure 104a has a first end E1 close to the top surface of the isolation structure 104a and a second end E2 opposite to the first end E1. The one-third of the first sidewall S1 of the isolation structure 104a is measured from the first end E1 of the first sidewall S1 of the isolation structure 104a to the second end E2 of the first sidewall S1 of the isolation structure 104a. By making the gate structure 116 have the opening 10 that exposes a portion of the isolation structure 104a, the damage to the semiconductor structure caused by the hot carrier injection test can be effectively reduced, and the reliability of the semiconductor structure can be improved.

In some embodiments, the first gate portion 116a does not cover the first end E1 of the first sidewall S1 of the isolation structure 104a. In some embodiments, the second gate portion 116b covers the second end E2 of the first sidewall S1 of the isolation structure 104a, so as to ensure that the electrical properties of the semiconductor device are not affected. On the contrary, if the second gate portion 116b does not cover the second end E2 of the first side wall S1 of the isolation structure 104a, the opening 10 exposes too much of the isolation structure 104a, which will affect the electrical properties of the semiconductor device, thereby affecting the originally intended functions or uses of the semiconductor device.

In a direction from the second doped region 112 to the isolation structure 104a, the first gate portion 116a has a length L; and there is a distance D between the second doped region 112 and the first well region 106, where the length L is greater than the distance D. To be specific, the distance D is a perpendicular distance between a side surface of the second doped region 112 and an interface between the first well region 106 and the second well region 108. In some embodiments, the length L is greater than the distance D to ensure that the device can operate normally. If the length L is less than the distance D, the channel cannot be turned on. In an embodiment, one sidewall of the first gate portion 116a is substantially aligned with the second doped region 112, and the first gate portion 116a extends across the interface between the first well region 106 and the second well region 108, and the opening 10 exposes a portion of the first well region 106 and a portion of the isolation structure 104a. In an embodiment, the width of the opening 10 (the distance between the first gate portion 116a and the second gate portion 116b) is about 0.1 micrometer (μm) to 1.0 micrometer (μm), so as to ensure that the entire opening 10 can be filled in the subsequent process so that the subsequent process can be avoided from implanting a dopant into the substrate 102 from the opening 10, which affects the electrical properties of the device.

Figure 6:
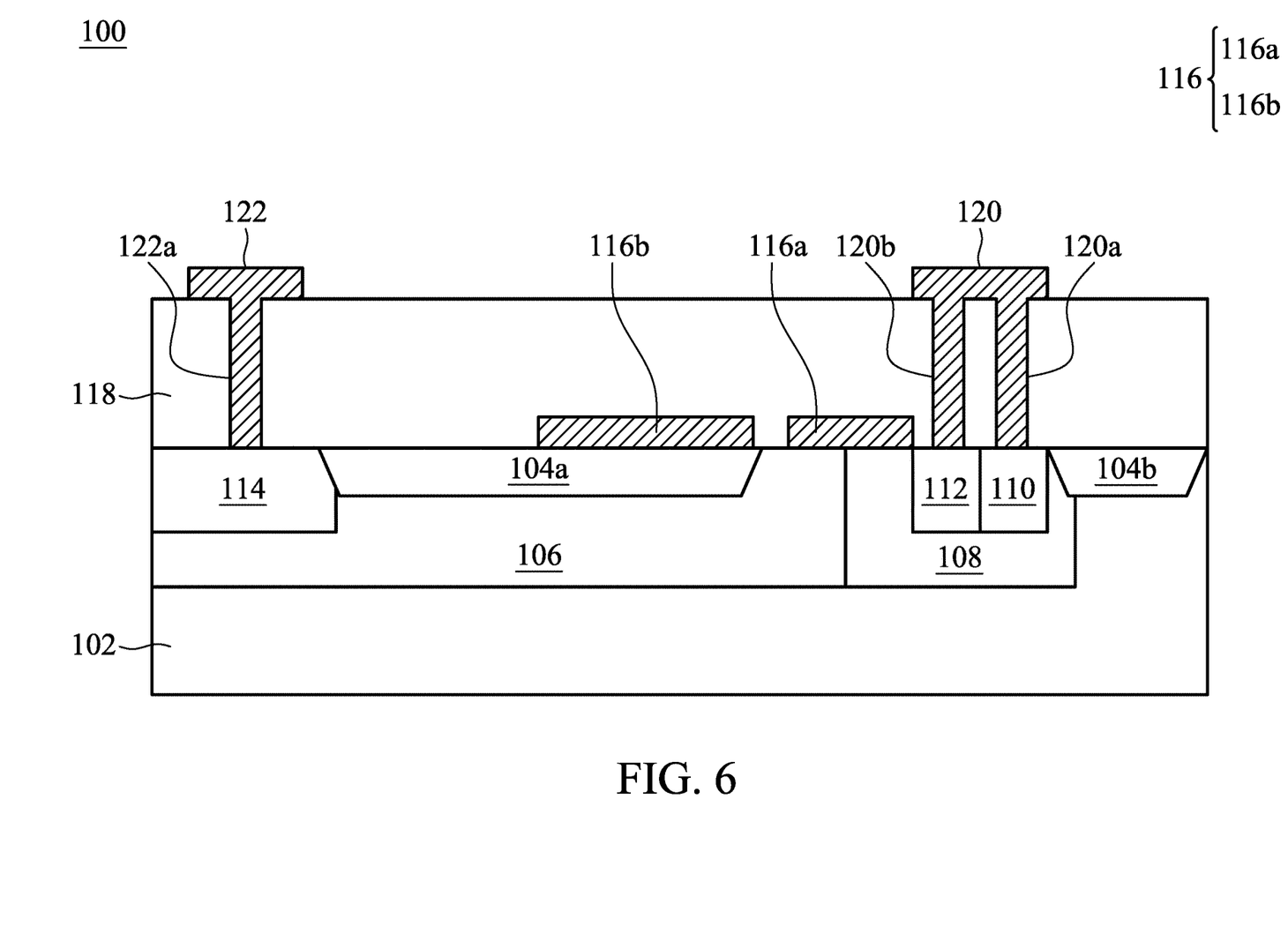
FIG. 6 is a cross-sectional view illustrating one stage of forming a semiconductor structure in accordance with the embodiments of the present disclosure.

Next, referring to FIG. 6, an interlayer dielectric (ILD) layer 118 is formed on the isolation structure 104a, the isolation structure 104b, the first gate portion 116a and the second gate portion 116b. The interlayer dielectric layer 118 also covers the first doped region 110, the second doped region 112, and the third doped region 114. The interlayer dielectric layer 118 may be formed of a dielectric material. In some embodiments, the material of the interlayer dielectric layer 118 may include silicon oxide, silicon nitride, phosphosilicate glass (PSG), borophosphosilicate glass (BPSG), or other suitable dielectric materials or a combination thereof. In addition, in some embodiments, the interlayer dielectric layer 118 may be formed using molecular-beam epitaxy (MBE), hydride vapor phase epitaxy (HVPE), metalorganic chemical vapor deposition (MOCVD), chemical vapor deposition, atomic layer deposition, physical vapor deposition, molecular beam deposition, plasma enhanced chemical vapor deposition, other appropriate methods or a combination thereof to form. In an embodiment, the first gate portion 116a and the second gate portion 116b have substantially the same operating voltage or each of the first gate portion 116a and the second gate portion 116b has a fixed operating voltage. However, one of ordinary skill in the art may make the first gate portion 116a and the second gate portion 116b have a voltage difference, or either the first gate portion 116a or the second gate portion 116b may has a floating potential, depending on actual needs.

Then, a source electrode 120 and a drain electrode 122 are formed on the interlayer dielectric layer 118 in accordance with some embodiments. The source electrode 120 and the drain electrode 122 are correspondingly disposed on the second well region 108 and the first well region 106. In some embodiments, the first gate portion 116a and the second gate portion 116b are disposed between the source electrode 120 and the drain electrode 122. In addition, in some embodiments, contact holes 120a, 120b and 122a are formed in the interlayer dielectric layer 118. In some embodiments, the contact hole 120a penetrates the interlayer dielectric layer 118 and contacts the source electrode 120 and the first doped region 110, the contact hole 120b penetrates the interlayer dielectric layer 118 and contacts the source electrode 120 and the second doped region 112, and the contact hole 122a penetrates the interlayer dielectric layer 118 and contacts the drain electrode 122 and the third doped region 114. As described above, the source electrode 120 may be electrically connected to the first doped region 110 and the second doped region 112 through the contact holes 120a and 120b, respectively, and the drain electrode 122 may be electrically connected to the third doped region 114 through the contact hole 122a.

The source electrode 120, the drain electrode 122, and the contact holes 120a, 120b and 122a may be formed of polysilicon, metal, or any other suitable conductive material. In some embodiments, the materials of the source electrode 120, the drain electrode 122, and the contact holes 120a, 120b and 122a each may include copper (Cu), aluminum (Al), molybdenum (Mo), tungsten (W), gold (Au), chromium (Cr), nickel (Ni), platinum (Pt), titanium (Ti), iridium (Ir), rhodium (Rh), copper alloy, aluminum alloy, molybdenum alloy, tungsten alloy, gold alloy, chromium alloy, nickel alloy, platinum alloy, titanium alloy, tantalum alloy, iridium alloy, rhodium alloy, any other suitable conductive material, or a combinations thereof. In some embodiments, the materials of the source electrode 120, the drain electrode 122 and the vias 120a, 120b and 122a are different from each other.

In some embodiments, the source electrode 120, the drain electrode 122 and the contact holes 120a, 120b and 122a may be formed by a chemical vapor deposition (CVD) process, a sputtering process, a resistance heating evaporation process, an electron beam evaporation process, a pulsed laser deposition process, any other applicable process or a combination thereof. The chemical vapor deposition process may include a low-pressure chemical vapor deposition process, a low-temperature chemical vapor deposition process, a rapid thermal chemical vapor deposition process, a plasma enhanced chemical vapor deposition process, an atomic layer deposition process or other applicable process. The formation of the semiconductor structure 100 is substantially completed here.

The embodiments of the present disclosure may have one or more of the following advantages and the advantages should not limit the scope of the present disclosure:

(1) By making the gate structure have an opening that exposes a portion of the isolation structure, the damage to the semiconductor structure caused by the hot carrier injection test can be effectively reduced, and the reliability of the semiconductor structure can be improved.

(2) Furthermore, since the second gate portion of the gate structure covers the second end of the first sidewall of the isolation structure, it can be ensured that the electrical properties of the semiconductor device are not affected and that the originally intended uses or functions can still be exerted.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A semiconductor structure, comprising:
    a substrate;
    a first well region disposed in the substrate;
    a second well region disposed in the substrate and adjoining the first well region;
    an isolation structure disposed in the first well region; and a gate structure disposed on the substrate and comprising a first gate portion and a second gate portion, wherein the first gate portion overlaps the first well region and the second well region, and there is an opening between the first gate portion and the second gate portion that exposes a portion of the isolation structure, wherein the isolation structure has a first sidewall adjacent to the second well region, and the first sidewall of the isolation structure has a first end adjacent to a top surface of the isolation structure and a second end opposite to the first end, wherein an edge of the opening is horizontally between the first end and the second end.

2. The semiconductor structure as claimed in claim 1, wherein the opening between the first gate portion and the second gate portion overlaps the first sidewall in a direction of a vertical projection.

3. The semiconductor structure as claimed in claim 2, wherein the opening overlaps one-third of the first sidewall of the isolation structure in the direction of the vertical projection, and the one-third of the first sidewall of the isolation structure is measured along a direction from the first end of the first sidewall of the isolation structure to the second end of the first sidewall of the isolation structure.

4. The semiconductor structure as claimed in claim 2, wherein the first sidewall of the isolation structure has a first end adjacent to a top surface of the isolation structure and a second end opposite the first end, and the first gate portion does not cover the first end of the first sidewall of the isolation structure.

5. The semiconductor structure as claimed in claim 4, wherein the second gate portion covers the second end of the first sidewall of the isolation structure.

6. The semiconductor structure as claimed in claim 1, wherein the opening exposes a portion of the first well region.

7. The semiconductor structure as claimed in claim 1, wherein each of the first gate portion and the second gate portion has a fixed operating voltage, or either the first gate portion or the second gate portion has a floating voltage.

8. The semiconductor structure as claimed in claim 1, further comprising:
a first doped region disposed in the second well region; and
a second doped region disposed in the second well region and adjoining the first doped region, wherein in a direction from the second doped region to the isolation structure, the first gate portion has a length, there is a distance between the second doped region and the first well region, and the length is greater than the distance.

9. The semiconductor structure as claimed in claim 8, further comprising:
an interlayer dielectric layer disposed on the substrate;
a third doped region disposed in the first well region;
a source electrode penetrating the interlayer dielectric layer and electrically connected to the first doped region and the second doped region; and
a drain electrode penetrating the interlayer dielectric layer and electrically connected to the third doped region.

10. The semiconductor structure as claimed in claim 1, wherein the gate structure comprises at least one gate dielectric layer and at least one gate electrode layer.

11. A method of forming a semiconductor structure, comprising:
providing a substrate;
forming a first well region in the substrate;
forming a second well region in the substrate and adjoining the first well region;
forming an isolation structure in the first well region; and
forming a gate structure on the substrate, wherein the gate structure comprises a first gate portion and a second gate portion, the first gate portion overlaps the first well region and the second well region, and there is an opening between the first gate portion and the second gate portion that exposes a portion of the isolation structure, wherein the isolation structure has a first sidewall adjacent to the second well region, and the first sidewall of the isolation structure has a first end adjacent to a top surface of the isolation structure and a second end opposite to the first end, wherein an edge of the opening is horizontally between the first end and the second end.

12. The method of forming a semiconductor structure as claimed in claim 11, wherein the opening between the first gate portion and the second gate portion overlaps the first sidewall in a direction of a vertical projection.

13. The method of forming a semiconductor structure as claimed in claim 12, wherein the opening overlaps one-third of the first sidewall of the isolation structure in the direction of the vertical projection, and the one-third of the first sidewall of the isolation structure is measured along a direction from the first end of the first sidewall of the isolation structure to the second end of the first sidewall of the isolation structure.

14. The method of forming a semiconductor structure as claimed in claim 12, wherein the first sidewall of the isolation structure has a first end adjacent to a top surface of the isolation structure and a second end opposite to the first end, and the first gate portion does not cover the first end of the first sidewall of the isolation structure.

15. The method of forming a semiconductor structure as claimed in claim 14, wherein the second gate portion covers the second end of the first sidewall of the isolation structure.

16. The method of forming a semiconductor structure as claimed in claim 11, wherein the opening exposes a portion of the first well region.

17. The method of forming a semiconductor structure as claimed in claim 11, wherein each of the first gate portion and the second gate portion has a fixed operating voltage, or either the first gate portion or the second gate portion has a floating voltage.

18. The method of forming a semiconductor structure as claimed in claim 11, further comprising:
forming a first doped region in the second well region; and
forming a second doped region in the second well region and adjoining the first doped region, wherein in a direction from the second doped region to the isolation structure, the first gate portion has a length, there is a distance between the second doped region and the first well region, and the length is greater than the distance.

19. The method of forming a semiconductor structure as claimed in claim 18, further comprising:
forming an interlayer dielectric layer on the substrate;
forming a third doped region in the first well region;
forming a source electrode penetrating the interlayer dielectric layer and electrically connected to the first doped region and the second doped region; and
forming a drain electrode penetrating the interlayer dielectric layer and electrically connected to the third doped region.

20. The method of forming a semiconductor structure as claimed in claim 11, wherein the gate structure comprises at least one gate dielectric layer and at least one gate electrode layer.

* * * * *